(12) United States Patent
Hwang et al.

(10) Patent No.: US 11,094,561 B2
(45) Date of Patent: Aug. 17, 2021

(54) SEMICONDUCTOR PACKAGE STRUCTURE

(71) Applicant: TAIWAN SEMICONDUCTOR MANUFACTURING CO., LTD., Hsinchu (TW)

(72) Inventors: Chien-Ling Hwang, Hsinchu (TW); Bor-Ping Jang, Hsinchu County (TW); Chung-Shi Liu, Hsinchu (TW); Hsin-Hung Liao, Taipei (TW); Ying-Jui Huang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/896,039

(22) Filed: Jun. 8, 2020

(65) Prior Publication Data
US 2020/0303214 A1   Sep. 24, 2020

Related U.S. Application Data

(63) Continuation of application No. 14/622,484, filed on Feb. 13, 2015, now Pat. No. 10,679,866.

(51) Int. Cl.
*H01L 21/56* (2006.01)
*H01L 23/482* (2006.01)
(Continued)

(52) U.S. Cl.
CPC .......... *H01L 21/563* (2013.01); *H01L 21/486* (2013.01); *H01L 21/568* (2013.01); *H01L 23/3121* (2013.01); *H01L 23/4828* (2013.01); *H01L 23/49827* (2013.01); *H01L 23/49811* (2013.01); *H01L 23/5389* (2013.01);
(Continued)

(58) Field of Classification Search
CPC ..... H01L 2924/00014; H01L 2924/181; H01L 2924/00012; H01L 2924/15311; H01L 2224/16225; H01L 2224/73265; H01L 2924/014
USPC ................ 257/737, 774, E21.502, E23.021, 257/E23.068; 438/107, 124, 127
See application file for complete search history.

(56) References Cited

U.S. PATENT DOCUMENTS

| | | |
|---|---|---|
| 4,813,129 A | 3/1989 | Kamezos |
| 5,334,804 A | 8/1994 | Love |

(Continued)

FOREIGN PATENT DOCUMENTS

| | | |
|---|---|---|
| CN | 1320964 A | 11/2001 |
| CN | 103311192 A | 9/2013 |

(Continued)

*Primary Examiner* — Jonathan Han
(74) *Attorney, Agent, or Firm* — Maschoff Brennan

(57) ABSTRACT

A semiconductor package structure includes a molding compound, a micro pin extending through the molding compound, and a die surrounded by the molding compound. The micro pin has a top surface, a bottom surface, and a sidewall extending from the bottom surface to the top surface of the micro pin. The sidewall of the micro pin has a first portion and a second portion. The first portion of the sidewall is adjacent to the bottom surface of the micro pin and free of the molding compound. The second portion of the sidewall is adjacent to the top surface of the micro pin and in contact with the molding compound.

20 Claims, 16 Drawing Sheets

(51) Int. Cl.
*H01L 23/31* (2006.01)
*H01L 21/48* (2006.01)
*H01L 23/498* (2006.01)
H01L 21/60 (2006.01)
H01L 21/603 (2006.01)
H01L 23/538 (2006.01)

(52) U.S. Cl.
CPC ............... *H01L 2021/603* (2013.01); *H01L 2021/6027* (2013.01); *H01L 2021/60277* (2013.01); *H01L 2224/16245* (2013.01); *H01L 2924/181* (2013.01)

(56) References Cited

U.S. PATENT DOCUMENTS

| | | |
|---|---|---|
| 5,574,311 A | 11/1996 | Matsuda |
| 6,307,161 B1 | 10/2001 | Grube |
| 6,322,374 B1 | 11/2001 | Comtois |
| 9,224,717 B2 | 12/2015 | Sato et al. |
| 2002/0132463 A1 | 9/2002 | Urushima |
| 2006/0170112 A1 | 8/2006 | Tanaka et al. |
| 2008/0023805 A1* | 1/2008 | Howard ............ H01L 24/97 257/666 |
| 2008/0157329 A1* | 7/2008 | Inoue ............ H01L 21/563 257/686 |
| 2011/0285009 A1 | 11/2011 | Chi |
| 2012/0038034 A1 | 2/2012 | Shin |
| 2012/0061814 A1* | 3/2012 | Camacho ........ H01L 23/49811 257/676 |
| 2012/0280386 A1 | 11/2012 | Sato et al. |
| 2012/0280404 A1 | 11/2012 | Kwon |
| 2013/0154108 A1* | 6/2013 | Lin ............ H01L 23/49816 257/774 |
| 2013/0277851 A1* | 10/2013 | Lin ............ H01L 23/48 257/773 |
| 2013/0307140 A1 | 11/2013 | Huang et al. |
| 2014/0103527 A1* | 4/2014 | Marimuthu ........ H01L 23/3128 257/737 |
| 2015/0061095 A1 | 3/2015 | Choi |
| 2015/0140736 A1* | 5/2015 | Pendse ............ H01L 24/00 438/109 |

FOREIGN PATENT DOCUMENTS

| | | |
|---|---|---|
| CN | 103582946 A | 2/2014 |
| JP | 2006210745 A | 8/2006 |
| KR | 10-0210691 B1 | 7/1999 |
| KR | 20120125148 A | 11/2012 |
| KR | 10-2013-0129058 A | 11/2013 |
| WO | 95/14314 A1 | 5/1995 |
| WO | 2014/107301 A1 | 7/2014 |

* cited by examiner

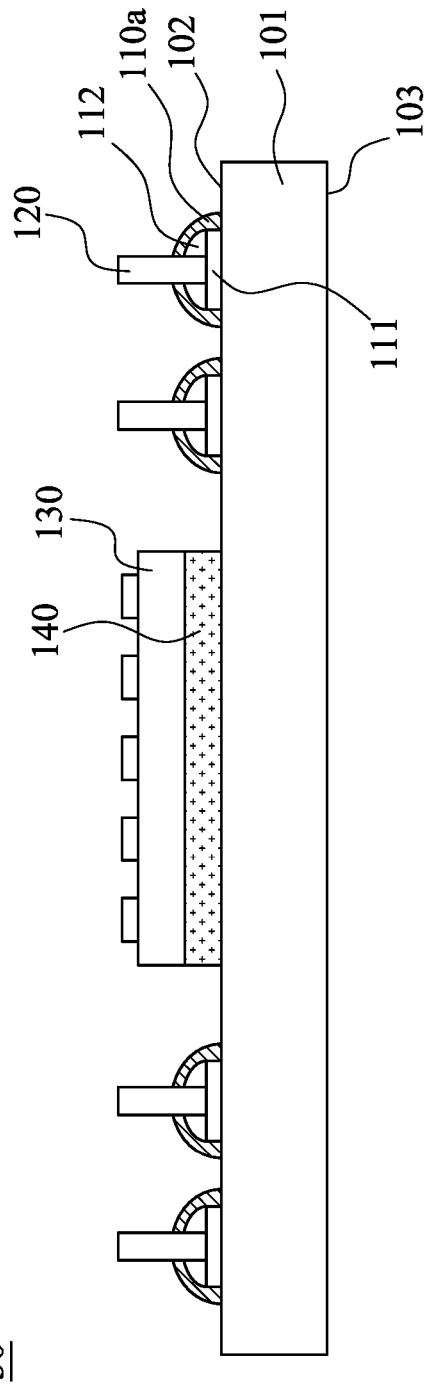
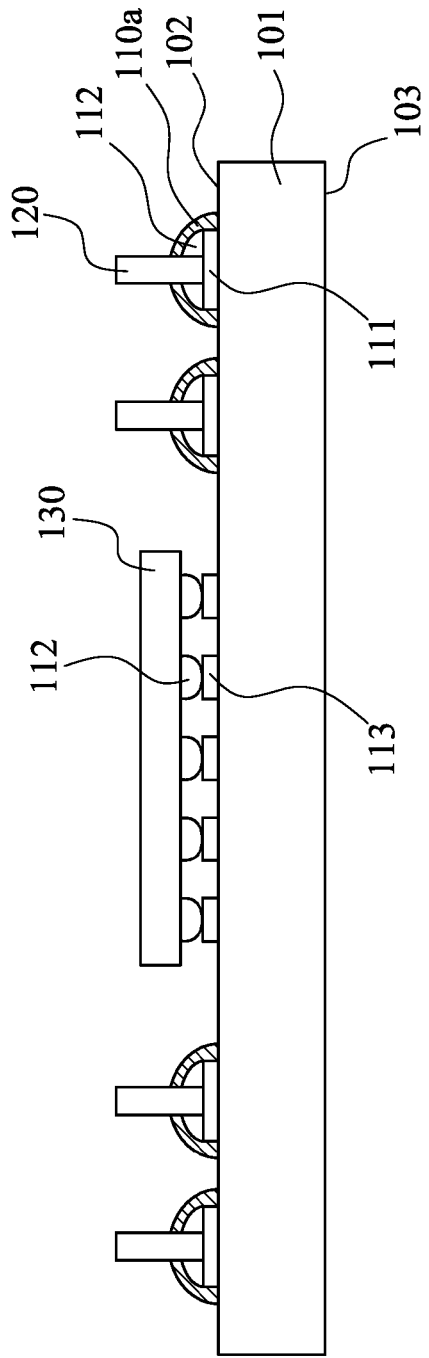
Fig. 3
Fig. 4

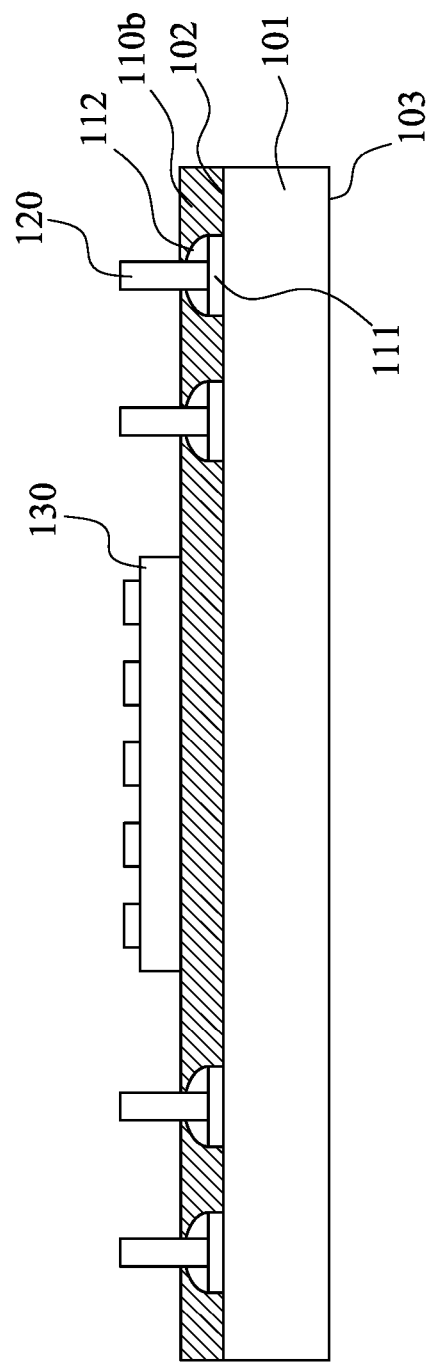
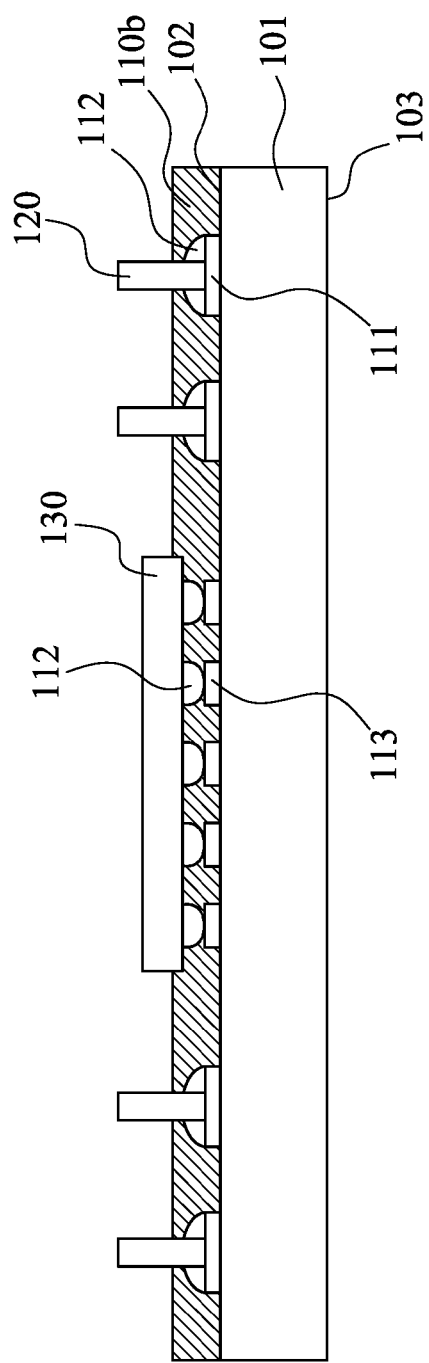

SEMICONDUCTOR PACKAGE STRUCTURE

PRIORITY CLAIM AND CROSS-REFERENCE

This application is a continuation application of U.S. patent application Ser. No. 14/622,484, filed Feb. 13, 2015, now U.S. Pat. No. 10,679,866, issued Jun. 9, 2020, which is herein incorporated by reference in its entirety.

BACKGROUND

Semiconductor devices are implemented in many different types of electrical products from digital cameras to handheld devices. In the manufacture of a semiconductor device, layers upon layers of various materials are stacked in succession with intertwined connections and carefully designed joint mechanism.

Devices are designed to have a more compact dimension, and the components have to shrink so as to fit into a relatively small space. In this regard, how the components are stacked or packed is critical in device size. Package on package (PoP) is developed to accommodate more components in a given area by well-organized stacking. The number of electronic components within a given area in the semiconductor device indeed increases, while the high component density is inevitably accompanied by an increase of input/output (I/O) number. The layout of PoP can have a great impact on the pitch that determines the I/O density, especially when it come to the joint mechanism. In other words, the bonding between the packages in a PoP structure can affect the dimensions of the electrical product to a great extent.

BRIEF DESCRIPTION OF THE DRAWINGS

Aspects of the present disclosure are well understood from the following detailed descriptions when reading with the accompanying figures. It is noted that, in accordance with the standard practice in the industry, various features are not drawn to scale. In fact, the dimensions of the various features may be arbitrarily increased or reduced for clarity of discussion.

FIG. 3 is a cross-sectional elevation view of a semiconductor package having a plurality of micro pins bound by adhesive portions in accordance with some embodiments of the instant disclosure;

FIG. 4 is a cross-sectional elevation view of a semiconductor package having a plurality of micro pins and a flip-chip bonded by solder joint in accordance with some embodiments of the instant disclosure;

FIG. 5 is a cross-sectional elevation view of a semiconductor package having a plurality of micro pins bound by adhesive portions in accordance with some embodiments of the instant disclosure;

FIG. 6 is a cross-sectional elevation view of a semiconductor package having a plurality of micro pins and a flip-chip bonded by joint portions in accordance with some embodiments of the instant disclosure;

DETAILED DESCRIPTION

Figure 1:
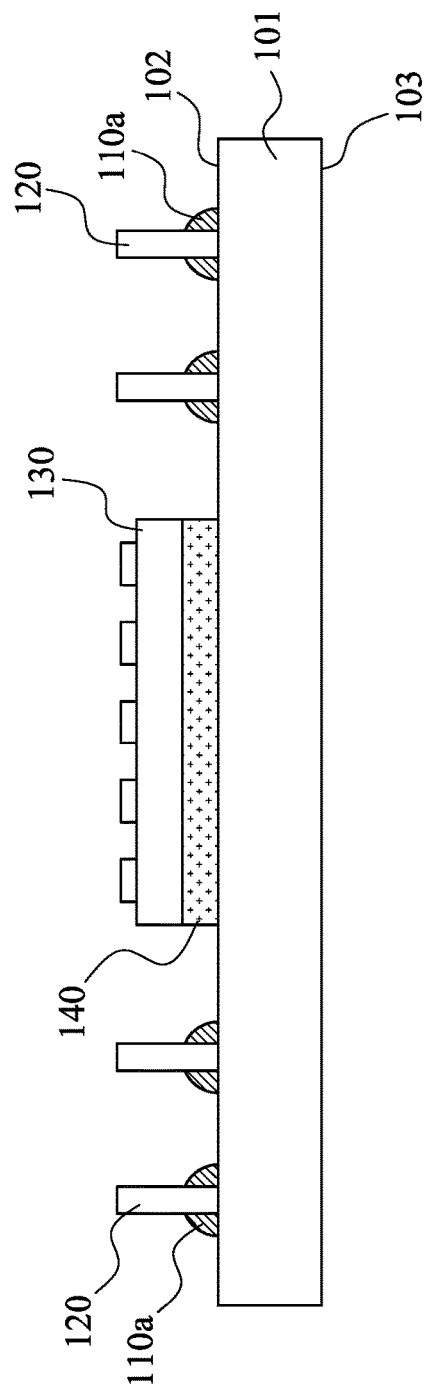
FIG. 1 is a cross-sectional elevation view of a semiconductor package having a plurality of micro pins in accordance with some embodiments of the instant disclosure.

The following disclosure provides many different embodiments, or examples, for implementing different features of the provided subject. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Package on package (PoP) structure has been developed for integrating more electronic components within a limited area. However, different types of package bonding greatly influence the pitch of PoP and further affect its function and memory capacity.

Typical PoP employs sizable solder ball for joining two immediately adjacent packages. In order to produce high component density, each of the solder balls is closely arranged, leaving hardly sufficient gap in between. Upon high temperature heating and pressing, the solder balls are prone to expand towards not only the intended corresponding soldering ball on the other package but also the neighbouring solder balls in lateral direction. Consequently, lateral bridges are formed and result in circuit failure.

It is known to use molding in the through-mold via (TMV) technique to reduce bridge occurrence in the conventional solder ball PoP. A via, which is treated with conductive material, through the molding is created to expose the pad on one substrate and for receiving solder balls at a more precise position, i.e., the opening of a via. However, to expose the vias, additional laser drilling process is required, which cost increases with the number of I/O.

Bond via array (BVA) is still another way to increase the number of I/O without compromising the conductivity. BVA is a wire-bond based interconnect technology utilizing gold or copper wires. However, many potential issues exist in the formation of the bonding wires, for example, how to terminate the wire tip at a uniform height in a predetermined position, or how to ensure the wire tip being firmly held by solder balls after reflow. Any irregularity of bond wires will likely result in package shifting. Furthermore, the cost of BVA assembly is considerably high due to the cost of individual bonding wires.

Attention is now invited to FIG. 1. A cross-sectional elevation view of a semiconductor package structure 10 is shown in accordance with some embodiments of the instant disclosure. The semiconductor package structure 10 includes a carrier 101, adhesive portions 110*a* and 140, a plurality of micro pins 120 and a die 130. The carrier 101 has a first surface 102 and a second surface 103 opposite to the first surface. The carrier 101 may constitute any suitable material or combination of materials upon which an integrated circuit may be formed, such as laminate, ceramic, printed circuit board, glass or silicon wafer for package in package application. In the present embodiment, the adhesive portions include adhesive paste portions 110*a* and a die attaching film 140. The adhesive paste portions 110*a* may be made of nonconductive adhesive film or the like and are formed on the first surface 102 of the carrier 101 by, for example, screen printing or other deposition methods known to a person of ordinary skill in the art. The adhesive paste portions 110*a* are distributed in a substantially rectangular or square array having one or plurality rows of adhesive paste portions 110*a*. The adhesive paste portions 110*a* enclose a die attaching area in the central region. The pitch between each row is approximately equally spaced apart and can be as narrow as 120 μm. However, it should be understood that the adhesive paste portions 110*a* can be distributed in any suitable pattern, whether uniform or non-uniform in spacing.

As shown in FIG. 1, in the present embodiment each of the adhesive paste portions 110*a* is spatially independent from the other adhesive portions 110. In other words, the adhesive portions 110*a* form a plurality of adhesive islands skirting the die attaching region on the first surface 102. The die attaching film 140 is disposed on the first surface 102 at the die attaching area defined by the adhesive paste portions 110*a* for bonding the die 130. In the present embodiment, two rows of the adhesive paste portions make up the square matrix and the perimeter of the die attaching area. In other words, the die attaching film 140 is surrounded by the substantially concentric, multiple ring pattern, which is created by the adhesive paste portions 110*a*. Each of the micro pins 120 is positioned to one of the adhesive paste portions 110*a* and disposed therein.

Figure 13:
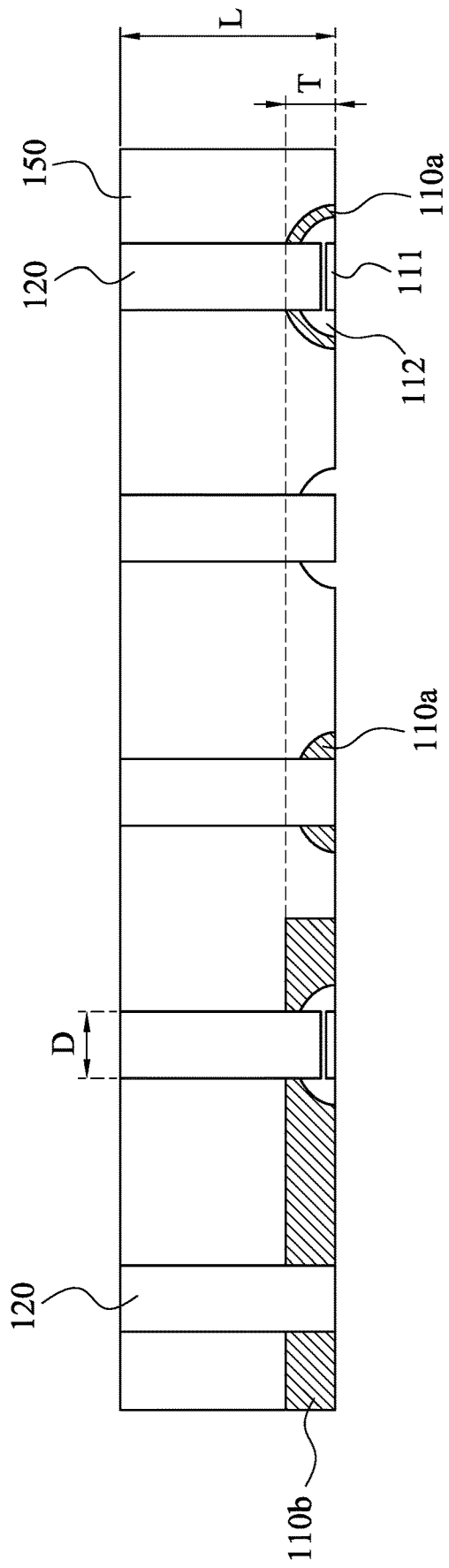
FIG. 13 is a close-up view of a plurality of micro pins in various adhesive mechanisms in accordance with some embodiments of the instant disclosure.

Attention is now invited to FIG. 13. The micro pin 120 may be made of copper, gold or alloy of any suitable metals and resembles a cylindrical pillar in profile. The tip of the micro pin 120 goes through treatment, for example, coating or dipping to an agent, to ensure its contact point being relatively planar. The micro pin 120 has a dimension where a length (L) ranges between 100 and 900 μm, and a diameter (D) is at least 50 um smaller than the length (i.e., L-50 μm). However, it should be understood that the micro pin 120 may have other geometrical configurations satisfying the above dimensional restriction. For example, the micro pin 120 may resemble the letter "T" where a relatively short bar is normally disposed on another elongated bar. The thickness T of the adhesive paste portion 110*a* varies according to the dimension of the micro pin 120. More specifically, the base of the micro pin 120, where it is in contact with the first surface 102 of the carrier 101, mates with the adhesive paste portion 110*a* by approximately one third of its total length (i.e., ⅓ L). Excessive adhesive paste portion 110*a* thicknesswise may result in adhesive material overflow in unwanted orientation, for example, upwards.

Please refer to FIG. 1 again. The die 130 is disposed on the die attaching film 140, and the semiconductor package structure 10 can be bonded with another package through the micro pins 120. In the present embodiment, as the die pads are exposed for connection, the height of the micro pins 120 reaches the same level as the die pads. The uniform height between the tip of the micro pins 120 and the die pads allows easier electrical connection in the following process.

Figure 2:
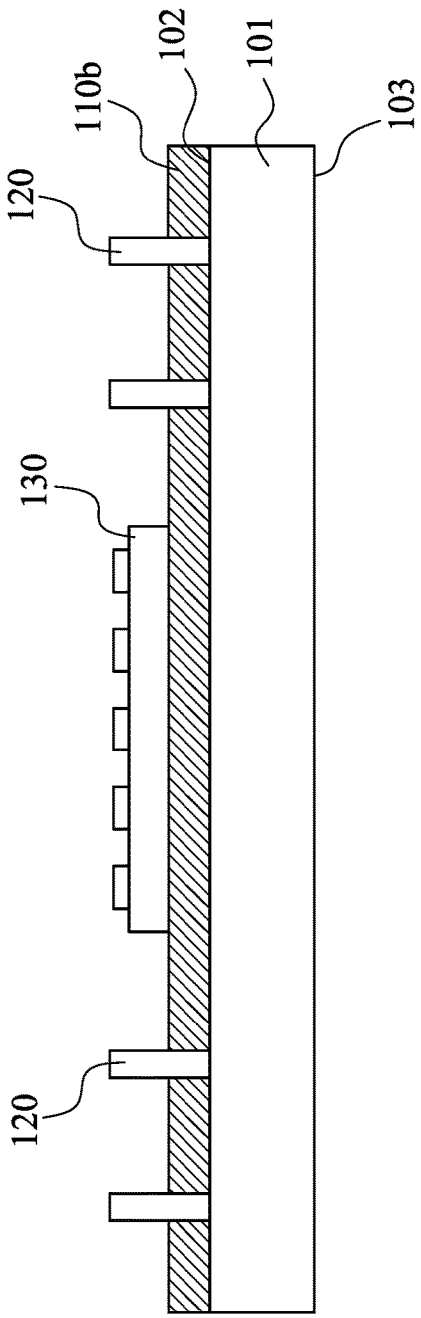
FIG. 2 is a cross-sectional elevation view of a semiconductor package having a plurality of micro pins in accordance with some embodiments of the instant disclosure.

Attention is now invited to FIG. 2. A semiconductor package structure 20 in accordance with some embodiments of the instant disclosure is provided. The semiconductor package structure 20 includes a carrier 101 having a first surface 102 and a second surface 103 opposite to the first surface 102, an adhesive film 110*b*, a plurality of micro pins 120 and a die 130. The adhesive film 110*b* is disposed on the first surface 102.

Unlike the semiconductor package structure 10, the adhesive portion of the semiconductor package structure 20 is constituted by the adhesive film 110*b*. The adhesive film 110*b* can be formed by laminating, printing, coating, sputtering or the like. Alternatively, the adhesive film 110*b* can be a result of connecting the plurality of adhesive paste portions 110*a*. In the present embodiment, the adhesive film 110*b* has a thickness of approximately 10-35 um. As shown in FIG. 2, the micro pins 120 are distributed in any suitable pattern, which encloses a die attaching region within its boundary. Referring to FIG. 13, the micro pins 120 mate with the adhesive film 110*b* to approximately one third of the length of the micro pins 120. On the other hand, the die 130 is directly attached to the adhesive film 110*b* instead of the die attaching film 140. That is to say the blanket of the adhesive film 110*b* alone serves to retain components on the first surface 102.

Attention is now invited to FIG. 3. A semiconductor package structure 30 is provided. In the present embodiment, the semiconductor package structure 30 includes a carrier 101 having a first surface 102 and a second surface 103 opposite to the first surface, a plurality of the adhesive portions 110*a*, 111, 112, and 140, a plurality of micro pins 120 and a die 130. The adhesive portions include a plurality of adhesive paste portions 110a, a plurality of pin pads 111, a plurality of solder pastes 112 and a die attaching film 140. A redistribution layer (not shown) is formed on the first surface 102, and the pin pads 111 are formed on the redistribution layer according to the predetermined micro pin pattern. In the present embodiment, the pin pads 111 are arranged in two rows, forming a square ring that encloses a die attaching area for accommodating the die 130. The solder paste 112 is disposed on each of the pin pads 111 by printing, coating or the like. The solder paste 112 resembles a hemispherical bump having a diameter lies on the first surface 102 (i.e., the redistribution layer). Please refer to FIG. 13. In other words, the possible widest contact area of a solder paste is determined once the solder paste is deposited. The hemispherical configuration prevents further expansion towards undesirable directions, for example, to the neighbouring solder pastes, when conducting reflow.

Each pair of the pin pad 111 and solder paste 112 is independently covered by the adhesive paste portion 110a. As shown in FIG. 3, one adhesive portion for the micro pin 120 is constructed by one pin pad 111, one solder paste 112 over the pin pad 111 and one adhesive paste portion 110a envelops both the pin pad 111 and solder paste 112. The adhesive portion 110a completely covers the pin pad 111 and solder paste 112. More specifically, the adhesive portion 110a is slightly thicker or higher than the solder paste such that upon micro pin 120 insertion, the micro pin 120 is firstly held by the adhesive paste portion 110a and later merges into the solder paste 112. Each of the adhesive portions surrounding the die attaching area receives one micro pin 120. It should be noted that each of the micro pin 120 is spatially independent because the adhesive portions are separated on the first surface 102. The die attaching film 140 is disposed at the die attaching area defined by the rings of micro pins 120 for receiving the die 130 thereon.

Please refer to FIG. 4. In the present embodiment, the semiconductor package structure is similar to the semiconductor package structure 30. To avoid repetition, only the difference is elaborated hereinafter. The die 130 is attached to the first surface 102 of the carrier 101 in a flip-chip form. The adhesive portions in the present embodiment further include a plurality of die pads 113. The die pads 113 are disposed at the die attaching area where it is clear of pin pads 111, and the die 130 is bonded to the die pads 113 through bumps (solder paste) 112. When another package is stacked on the present embodiment, the additional package contacts the micro pins 120.

Attention is now invited to FIG. 5. A cross-section view of a semiconductor package structure 40 in accordance with some embodiments of the instant disclosure is shown. The semiconductor package structure 40 includes a carrier 101 having a first surface 102 and a second surface 103 opposite to the first surface 102, a plurality of adhesive portions 110b, 111 and 112 and a die 130. The first surface 102 of the carrier 101 is formed with a redistribution layer (not shown), and a plurality of pin pads 111 is disposed on the redistribution layer. The pin pads 111 are arranged according to a predetermined pattern, which can be a closed ring formed by one or a plurality of concentric rows of micro pins 120. A solder paste 112 is disposed on each of the pin pads 111, and an adhesive film 110b completely covers the first surface 102 (i.e., the redistribution layer) and the pin pads 111, solder pastes 112 thereon. As shown in FIG. 5, the adhesive film 110b dominates the first surface 102 with micro pins 120 protruding out of each solder paste 112 and pin pad 111 island. In FIGS. 3 and 4, the adhesive portions are separated individual islands dotting on the first surface 102, while in the present embodiment, the adhesive portions are connected through the adhesive film 110b. As shown in FIG. 13, the thickness T of the adhesive film 110b is determined by two main factors: the length of the micro pin 120 and the size of the solder paste 112. The micro pins 120 define the die attaching area where the die 130 is received on a portion of the adhesive film 110b.

Please refer to FIG. 6. In the present embodiment, the difference arises from the die 130 deposition, which is a flip-chip. In addition to the pin pads 111, in the present embodiment, the semiconductor package structure further includes a plurality of die pads 113. The die pads 113 are disposed at the die attaching area enclosed by the micro pins 120. The die 130 is attached to the die pads 113 through bumps (solder paste) 112 as a flip chip.

Figure 7:
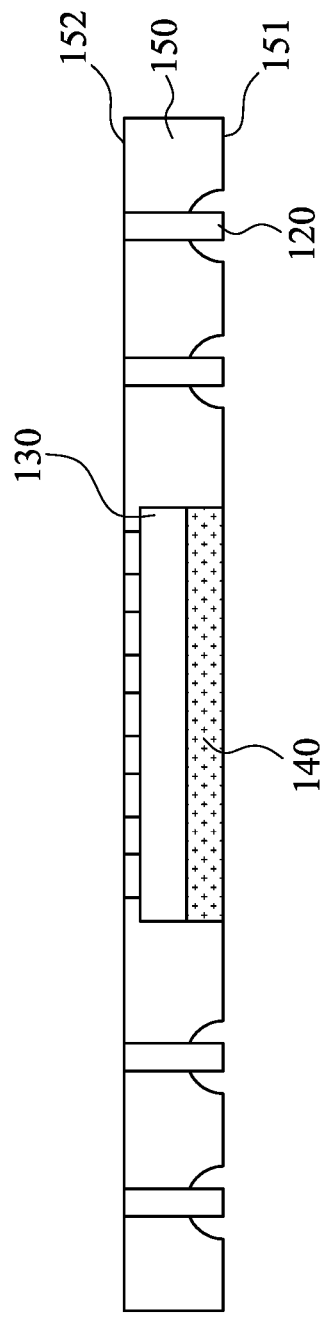
FIG. 7 is a cross-sectional elevation view of a semiconductor package having a molding compound and a plurality of micro pins in accordance with some embodiments of the instant disclosure.

Attention is now invited to FIG. 7. A cross-sectional elevation view of a semiconductor package structure 50 in accordance with some embodiments of the instant disclosure is shown. In the present embodiment, the semiconductor structure 50 is constructed based on the semiconductor package structure 10 shown in FIG. 1. In addition to the existing scaffolding, a molding compound 150 is formed on the first surface 102 of the carrier 101. The molding compound 150 has a first side 151 and a second side 152 opposite to the first side. The first side 151 is flush with the first surface 102 where it is clear of adhesive portions 110a and 140. The thickness of the molding compound varies according to the level of the pin tip and die pad. That is to say the second side 152 is at the same height where the micro pin 120 ends. The carrier 101 and some of the adhesive portions, in this case the adhesive paste portions 110a, are later removed to produce the semiconductor structure 50. The molding compound 150 enhances the structural strength of the semiconductor package 50 so as to minimize crashing caused by other components upon stacking. The die 130 is under thorough protection all around namely the die attaching film 140 from the bottom, the molding compound 150 from the sides and the top, the micro pins 120 from the perimeter, and the electrical connection can still be easily established by photolithography and electroplating process. Another component can be attached to the first side 151 or the second side 152 since the carrier 101 is removed to yield a vacancy. The micro pins 120 serves as interconnects in the absence of the carrier 101.

After the adhesive paste portions 110a are removed, the micro pins 120 at the first side 151 of the molding compound 150 are partially exposed. Furthermore, the void left behind by the adhesive paste portion can receive adhesive material, for example, solder ball. Solder ball can be disposed in the depression previously defined by the adhesive paste portion 110a and now the molding compound 150, and material overflow is less likely to occur because of spatial confinement. The die 130 is attached to the die attaching film 140, and both remain in the molding compound 150. It should be noted that the adhesive paste portions 110a can be retained in the semiconductor package structure 50 according to the requirement.

Figure 8:
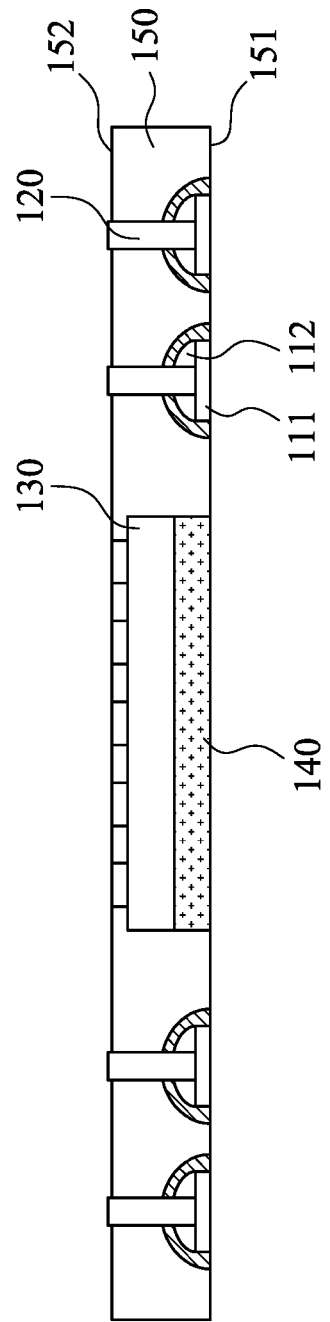
FIG. 8 is a cross-sectional elevation view of a semiconductor package having a molding compound and a plurality of micro pins bound by adhesive portions in accordance with some embodiments of the instant disclosure.

Attention is now invited to FIG. 8. A cross-sectional elevation view of a semiconductor package structure in accordance with some embodiments of the instant disclosure is shown. The present embodiment is constructed based on the structure 30. The molding compound 150 is formed on the first surface 102 (i.e., the redistribution layer) and encapsulates the micro pins 120, the die 130 and adhesive portions 110a, 111, 112 and 140. Likewise, the carrier 101 is temporary in the present embodiment and is removed at a later stage. Unlike the semiconductor package structure 50, in the present embodiment, the adhesive portions of the micro pins, namely, the pin pads 111, solder pastes 112 and the adhesive paste portions 110a, are retained in the structure. As shown in FIG. 8 in conjunction with FIG. 13, the pin pads 111, solder pastes 112 and adhesive paste portions 110a are exposed on the first side 151 of the molding compound 150. In the present embodiment, one end of the micro pin 120 is exposed from the second side 152 of the molding compound, while the other end of the micro pin 120 is engulfed by the adhesive portion.

Figure 9:
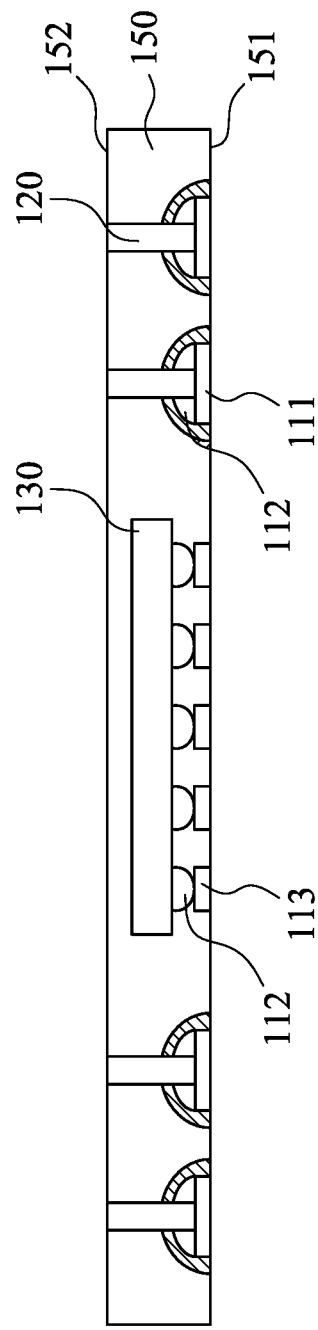
FIG. 9 is a cross-sectional elevation view of a semiconductor package having a molding compound, a plurality of micro pins bound by adhesive portions and a flip-chip in accordance with some embodiments of the instant disclosure.

Attention is now invited to FIG. 9. A cross-sectional elevation view of a semiconductor package structure in accordance with some embodiments of the instant disclosure is shown. The present embodiment is constructed based on the semiconductor structure shown in FIG. 4. Like the structure shown in FIG. 8, in the present embodiment, the adhesive portions of micro pin 120 are retained. The die attaching film 140 is replaced by a plurality of die pads 113, and the die 130 is attached to the die pads 113 through bumps 112 in a flip-chip form. The molding compound 150 further strengthens the structural durability of the semiconductor in the package on package scaffolding.

Figure 10:
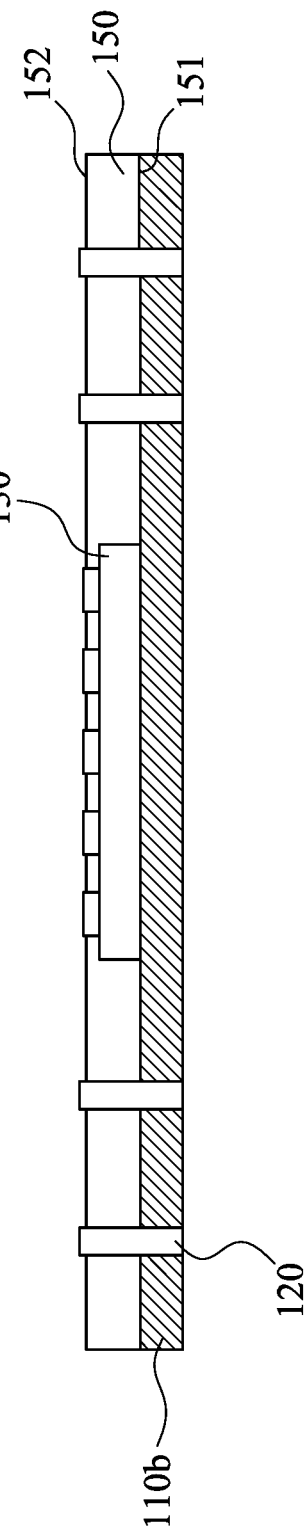
FIG. 10 is a cross-sectional elevation view of a semiconductor package having a molding compound and a plurality of micro pins bound by adhesive portions in accordance with some embodiments of the instant disclosure.

Attention is now invited to FIG. 10. A cross-sectional elevation view of a semiconductor package structure 60 in accordance with some embodiments of the instant disclosure is shown. The semiconductor package structure 60 is constructed based on the semiconductor package structure 20 shown in FIG. 2. The molding compound 150 is formed on the adhesive paste portion 110b in the present embodiment. The first side 151 of the molding compound 150 is flush with the adhesive paste portion 110a, interspersed by the micro pins 120 and the die 130 in a predetermined pattern. In the present embodiment, the thickness of the molding compound 150 depends on two main factors, namely, the adhesive paste portions 110b and the tip level of the micro pins 120. The molding compound 150 grows from the adhesive paste portion 110b and terminates when meeting the tip of the micro pin 120. As shown in FIG. 10 in conjunction with FIG. 13, despite the pattern created by the micro pins 120 and the die 130, the second side 152 of the molding compound 150 is substantially planar. The second side 152, tips of the micro pins 120 and die pads are substantially coplanar, and this configuration allows easier electrical connection between the micro pins 120 and the die pads at the second side 152. The molding compound 150 provides stronger structural support and at the same time does not compromise the access of either the micro pins 120 or the die 130.

Moreover, since the carrier 101 is removed in the present embodiment, micro pins 120 are free at both ends. Specifically, one end is exposed from the second side 152 of the molding compound and the other is exposed from the adhesive paste portion 110b after the removal of the temporary carrier. With both ends free, components can be jointed to either ends of the micro pin 120 through, for example, solder ball or any other suitable adhesive material. Similar to the micro pins 120 in the semiconductor package structure 50, the micro pins 120 can serve as interconnects.

Figure 11:
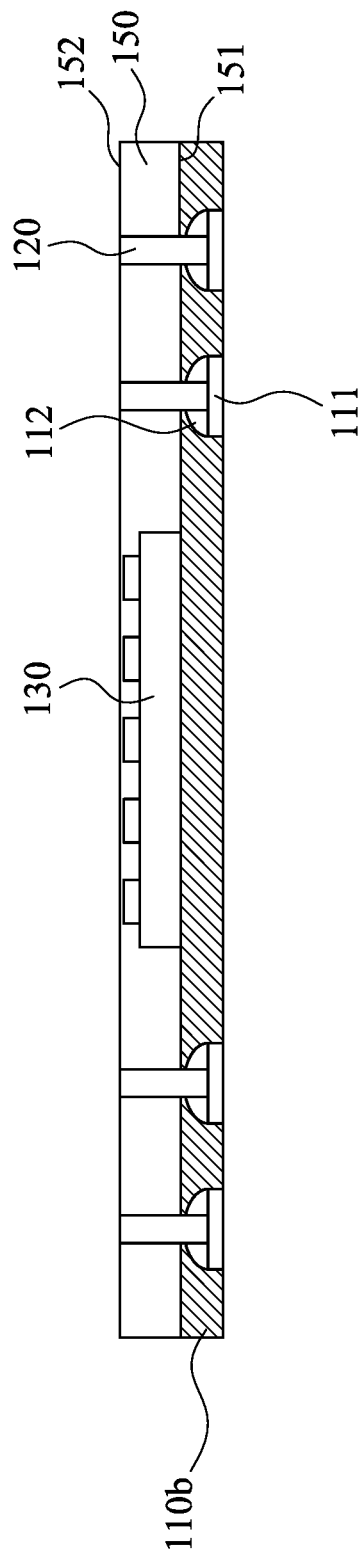
FIG. 11 is a cross-sectional elevation view of a semiconductor package having a molding compound and a plurality of micro pins bound by adhesive portions in accordance with some embodiments of the instant disclosure.

Please refer to FIG. 11. A semiconductor package structure in accordance with some embodiments of the instant disclosure is provided. The semiconductor package structure is constructed based on the structure shown in FIG. 5. Although the adhesive portions include the plurality of pin pads 111 and solder pastes 112, the molding compound 150 is still flush with the adhesive paste portion 110b and not in contact with the pin pads 111 or the solder pastes 112. As mentioned before, the adhesive paste portion 110b exceeds the combining thickness of the pin pad 111 and solder paste 112, and therefore a distance is created between the molding compound 150 and the apex of the hemispherical solder paste 112.

Figure 12:
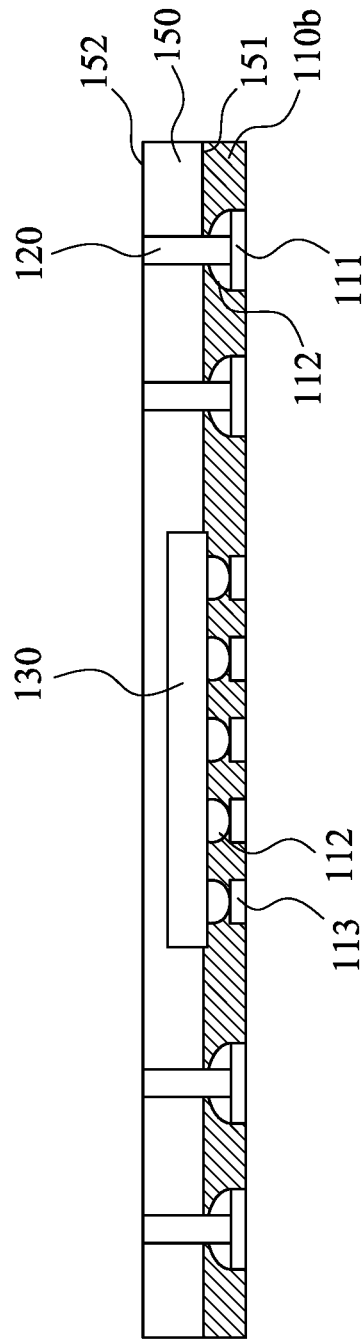
FIG. 12 is a cross-sectional elevation view of a semiconductor package having a molding compound, a plurality of micro pins and a flip-chip bound by adhesive and joint portions in accordance with some embodiments of the instant disclosure.

Please refer to FIG. 12. A semiconductor package structure in accordance with some embodiments of the instant disclosure is provided. The semiconductor package structure is constructed based on the structure shown in FIG. 6. The molding compound 150 is formed on the adhesive paste portion 110b. Unlike the embodiment shown in FIG. 11, the die 130 is attached to the die pads 113 in a flip-chip form. The micro pins 120 are not wire bonded to the die 130 but connected by redistribution layer.

Figure 14:
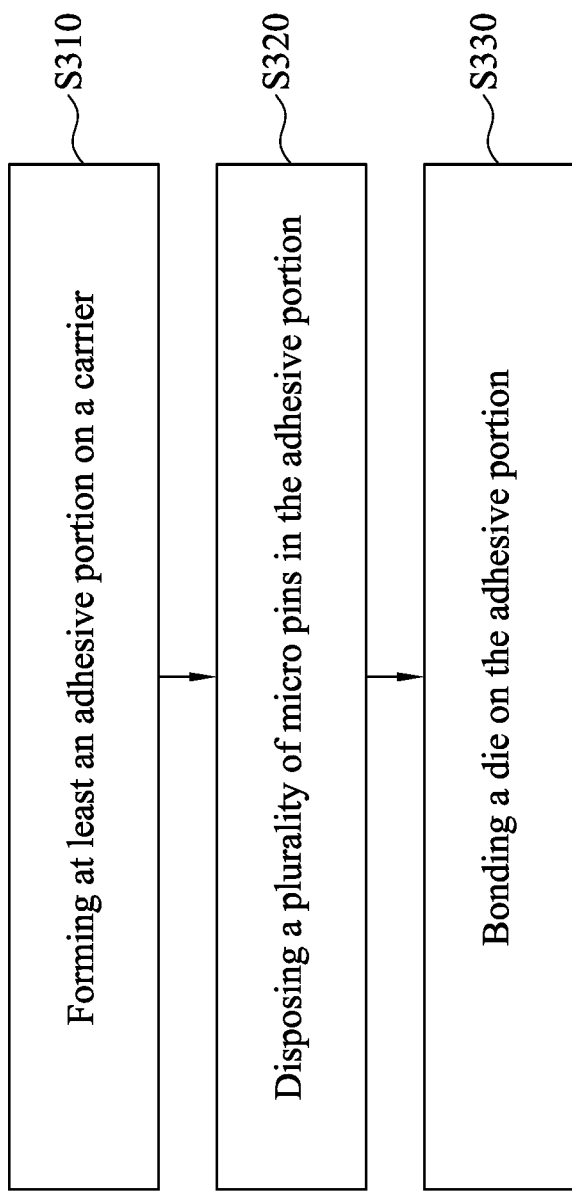
FIG. 14 is a flow chart showing a method of fabricating a semiconductor package in accordance with some embodiments of the instant disclosure.
Figure 15A:
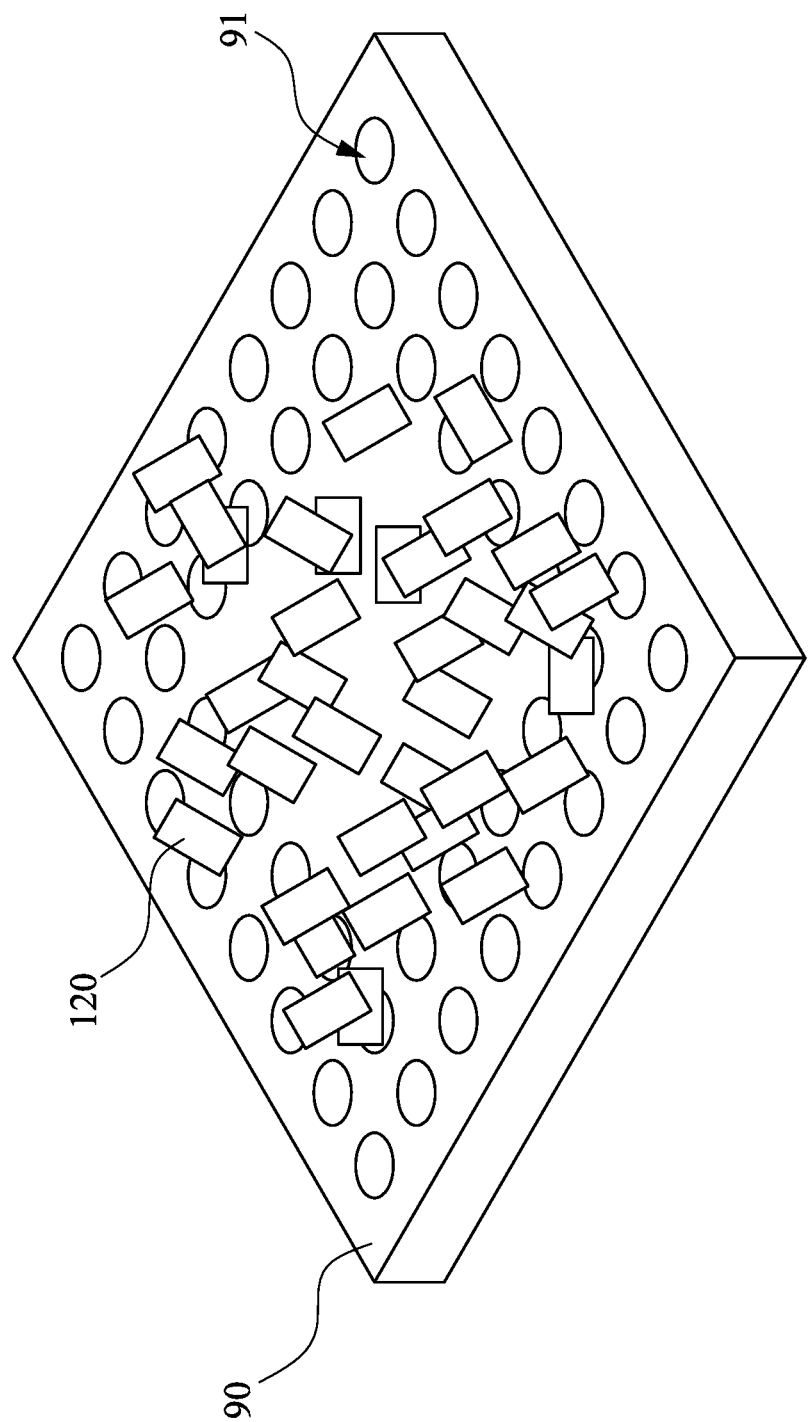
FIGS. 15A to 15G are schematic diagrams showing a method of fabricating a semiconductor package having a plurality of micro pins in accordance with some embodiments of the instant disclosure.
Figure 15B:
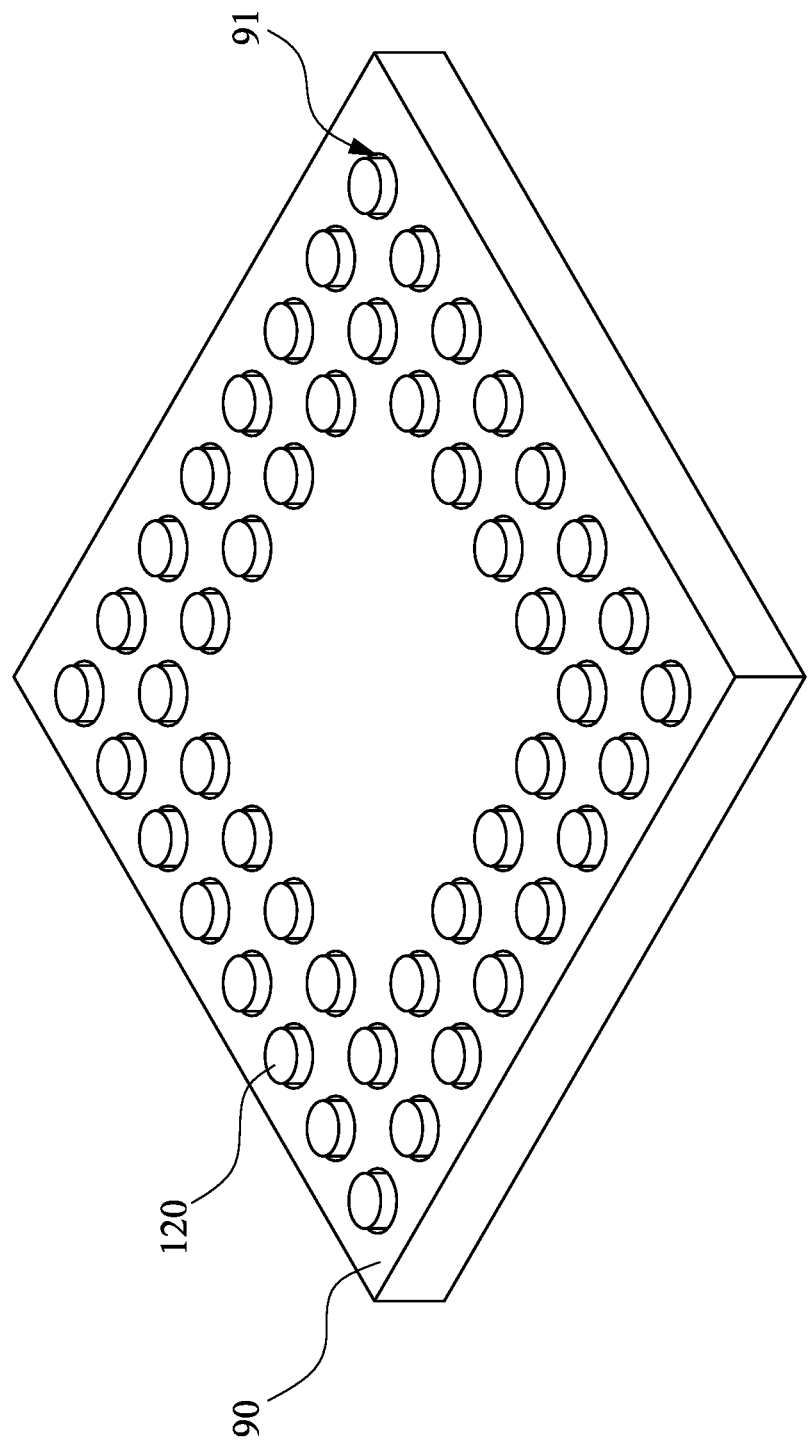

Turning now to FIG. 14, illustrated is an embodiment of a method of fabricating a semiconductor package structure. Embodiments of the method shown in FIG. 14 are further illustrated in the schematic diagrams of FIGS. 15A through 15G. Attention is now invited to FIG. 15A. A pallet 90 is provided, and a plurality of cavities 91 is formed by drilling, wet etching, plasma etching or the like on the pallet 90. The pallet 90 may be made of, for example, steal, plastic, graphite or any other suitable material. In the present embodiment, the pallet 90 is formed into a substantially rectangular block having the cavities 91 that open at a surface for temporarily accommodating a plurality of micro pins 120. The cavities 91 are arranged in one or plurality rows of square rings along the perimeter region of the pallet 90. In the present embodiment, the cavities 91 are evenly distributed with uniform spacing. However, the pattern may vary, for example, to form different geometrical configuration or non-uniform spacing.

A number of micro pins 120 in relation to the number of the cavities 91 are then randomly disposed on the pallet 90. A vibration is then applied to the pallet 90, and the micro pins 120 fall into the cavities 91. Since each of the cavities 91 receives one micro pin 120, the cavity dimension is closely related to the micro pin profile. More specifically, referring to FIG. 15B, if the micro pin 120 resembles a cylindrical pillar, the cavity 91 is shaped to hold one end of the micro pin 120 in its recess, and the other end of the micro pin 120 protrudes out of the cavity 91. The depth of the cavity 91 is approximately two thirds of the desirable micro pin length L so as to prevent false dispersion. The protruded portion of the micro pin 120 is approximately a third of its total length L. In some embodiments, micro pin 120 alignment may be carried out in pneumatic condition. For example, a channel (not shown) allowing air communication may lead to the cavity 91. More specifically, the channel having a relatively narrower diameter opens at the bottom of the cavity 91. When the micro pins 120 are under vibration, air is drawn out through the channel, and the suction power facilitates micro pin alignment. The pneumatic condition is especially suitable when the dimension of micro pins 120 is particularly small.

Figure 15C:
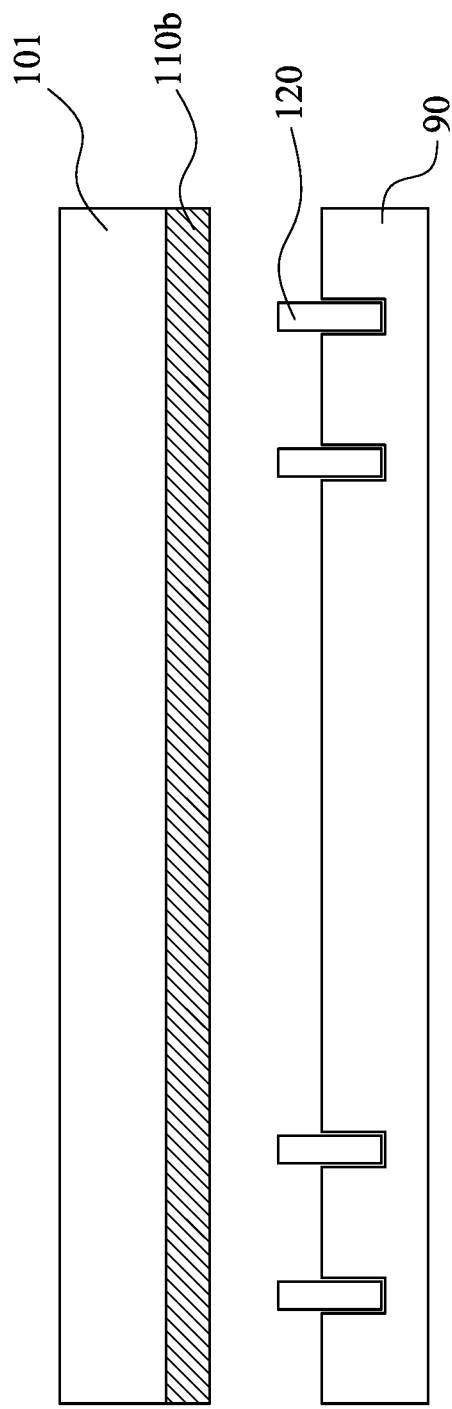
Figure 15D:
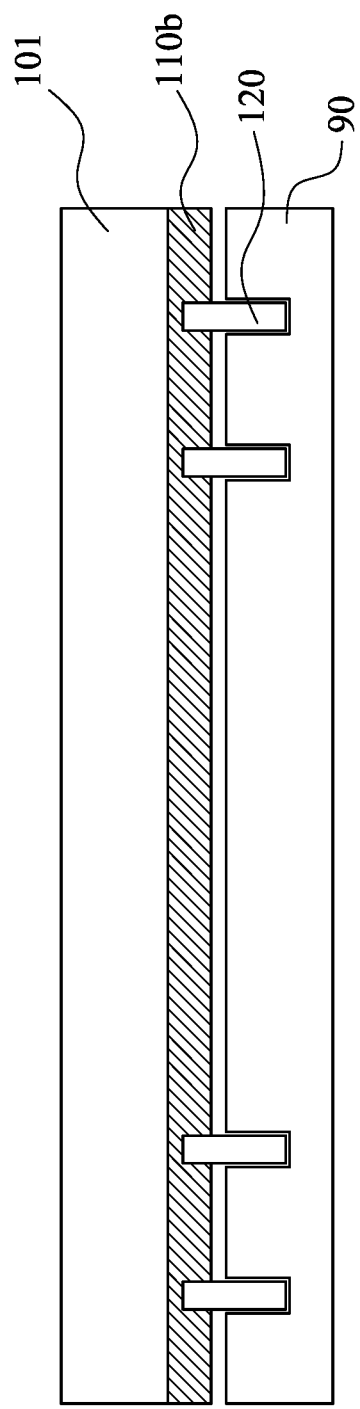

Referring to FIG. 15C now, a carrier 101 is provided. An adhesive portion laminates the surface of the carrier 101. The adhesive portion is identical to the previously described adhesive paste portion 110b which blankets the entire surface of the carrier 101 and serves as the attaching means for micro pins 120 and later the die 130. After pin alignment, the carrier 101 is positioned atop the pallet 90 with the adhesive film 110b facing the micro pins 120. The carrier 101 and the pallet 90 are aligned in any suitable angle, for example, in parallel, such that the micro pin pattern can be transferred to the carrier 101. Referring to FIG. 15D now, the micro pins 120 are then transferred to the carrier 101 by pressing under a first temperature to a first depth. In the present embodiment, the carrier 101 and the pallet 90 are made of different materials, namely, glass and steal, having varied coefficient of thermal expansion (CTE). In order to maintain the pin pattern in precise alignment during transferring, the first temperature should be under 100 degree Celsius such that the carrier 101 or the pallet 90 will not expand to an extent leading to misalignment. In the present embodiment, the first temperature ranges between 70 and 80 degree Celsius. However, the first temperature may vary according to the materials used for the carrier 101 and the pallet 90. In addition, although the micro pins 120 mate with the adhesive film 110b, micro pins 120 do not contact the surface of the carrier 101 at this stage. Because of the relatively mild temperature, the adhesive film 110b is not in full fluidity state, and therefore micro pins 120 are inserted to, for example, half way of the adhesive film thickness T.

Figure 15E:
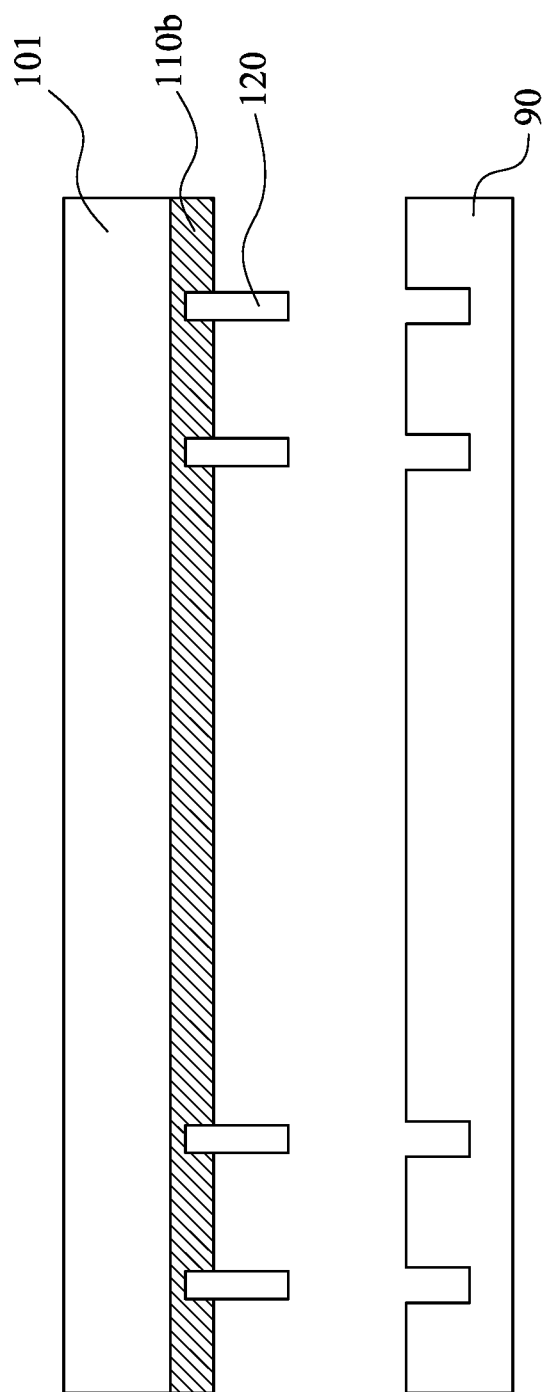
Figure 15F:
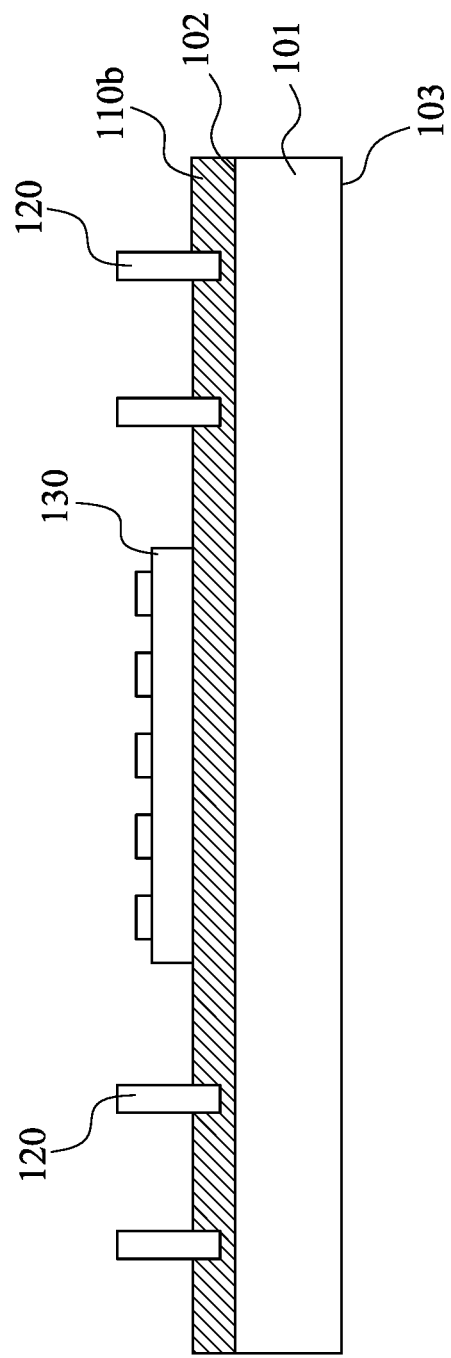
Figure 15G:
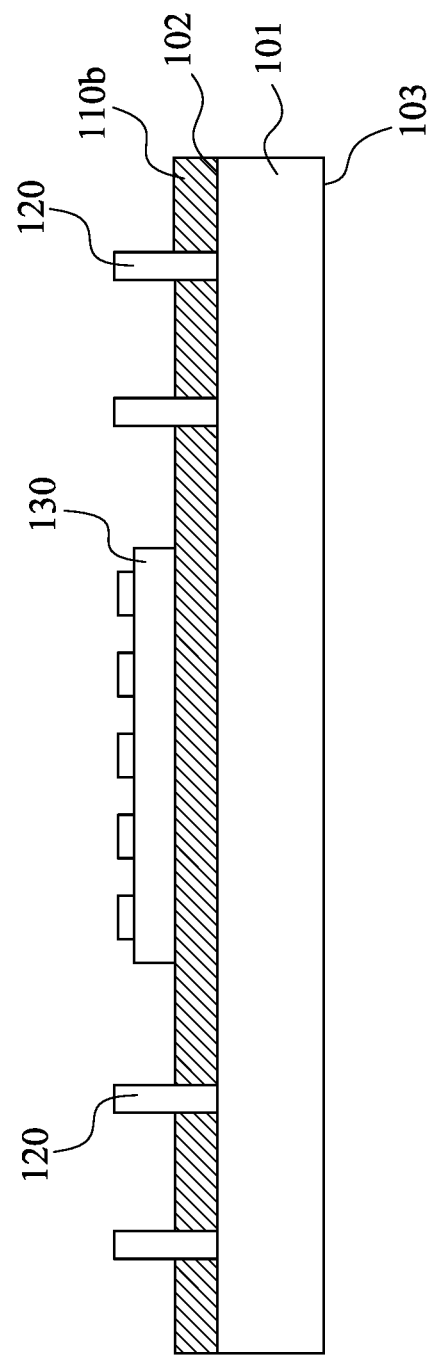

Referring to FIG. 15E, the micro pins 120 are transferred from the pallet 90 to the carrier 101 and held by the adhesive film 110b. The pattern created on the pallet 90 is translated to the carrier 101. Next, referring to FIG. 15F, the die 130 is disposed on the die attaching region defined by the micro pins 120. The die is placed on the adhesive film 110b in the present embodiment. In some embodiments, the adhesive portion is constituted by the plurality of adhesive paste portions 110a and the die attaching film 140, the die is attached to the die attached film 140. In yet another embodiment, the adhesive portions may be constituted by the plurality of adhesive paste portions 110a and a plurality of die attaching pads 113, and the die 130 is attached to the die attaching pads 113 through adhesive materials, for example, solder pastes or flux, in a flip-chip form. After the deposition of die 130, the micro pins 120 are pressed under a second temperature to a second depth. As previously described, due to different coefficients of thermal expansion of carrier 101 and pallet 90, the heating temperature is maintained under approximately 100 degree Celsius. As shown in FIG. 15G, in the absence of the pallet 90, the assembly is heated to a relatively high temperature, for example, 220 to 230 degree Celsius which allows full fluidity of the adhesive film 110b and therefore firmly holds the components. Because of the fluidity of the adhesive film 110b under higher temperature, the micro pins 120 attack all the way until they are in contact with the surface of the carrier 101. Finally, the assembly is cured and the semiconductor package structure is complete.

In some embodiments, a molding compound 150 (not shown) is formed on the adhesive film 110b shown in FIG. 15G. The thickness of the molding compound 150 varies according to the remaining portion of the micro pin 120 that does not mate with the adhesive portion. As shown in FIG. 13, the molding compound 150 envelops the remaining portion of the micro pin 120 up to the tip, where also die pads are exposed if not in a flip-chip form, to provide a substantially planar platform. The carrier 101 can then be removed because the molding compound 150 provides the structural strength the semiconductor package required. In addition, the removal of the carrier 101 allows connection from both sides of the micro pins 120. In some embodiments, the adhesive portions are in discontinuous forms of the adhesive paste portions 110a shown in FIG. 1. The molding compound 150 is therefore formed on the carrier 101 to cover the adhesive portions, micro pins 120 and die 130. Furthermore, after the formation of the molding compound 150, the adhesive paste portions 110a can be removed to form voids that expose a portion of the micro pin 120. The voids may serve to accommodate other adhesive materials, for example, solder balls, in the following attachment process.

Figure 16A:
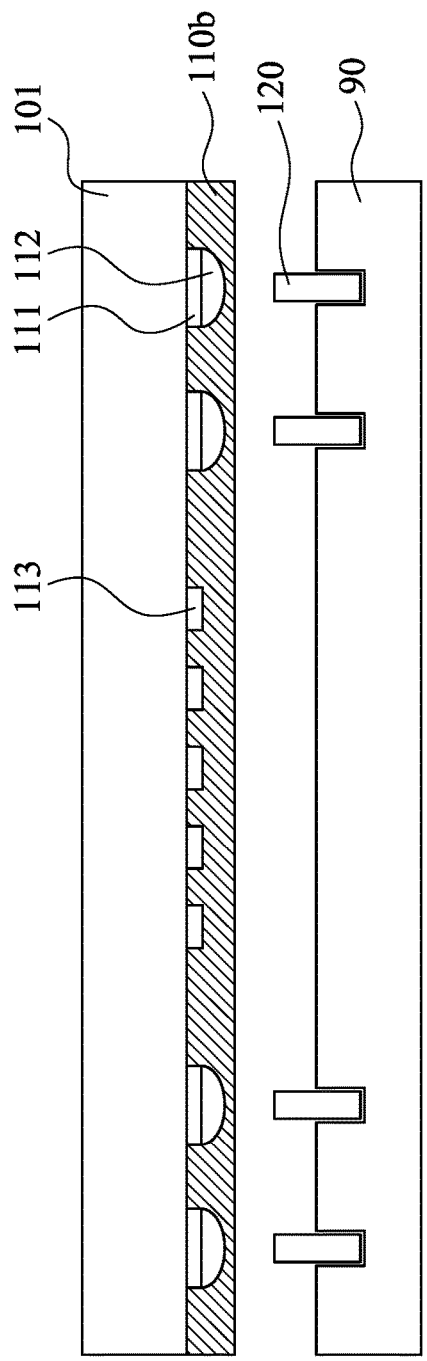
FIGS. 16A to 16E are schematic diagrams showing a method of fabricating a semiconductor package having a plurality of micro pins in accordance with some embodiments of the instant disclosure.
Figure 16B:
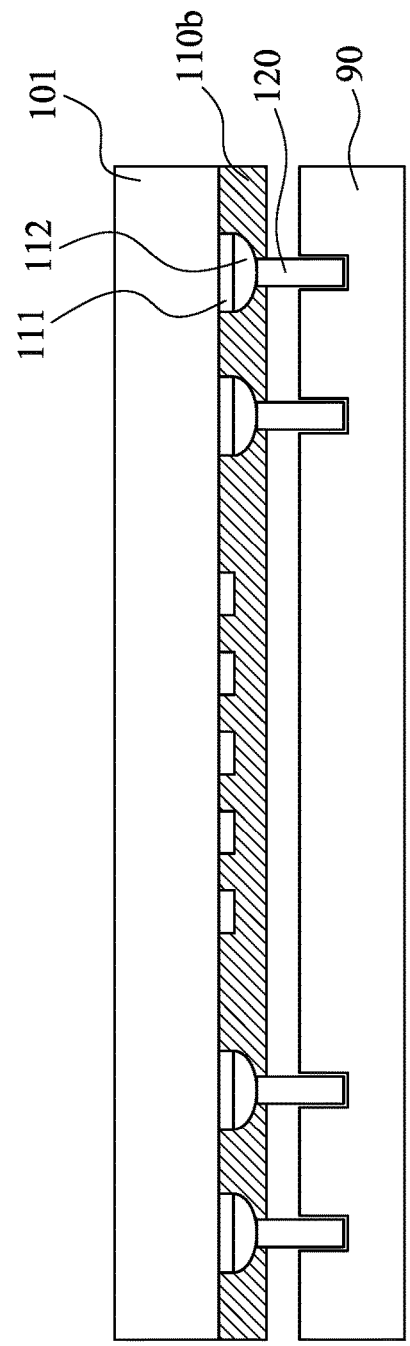
Figure 16C:
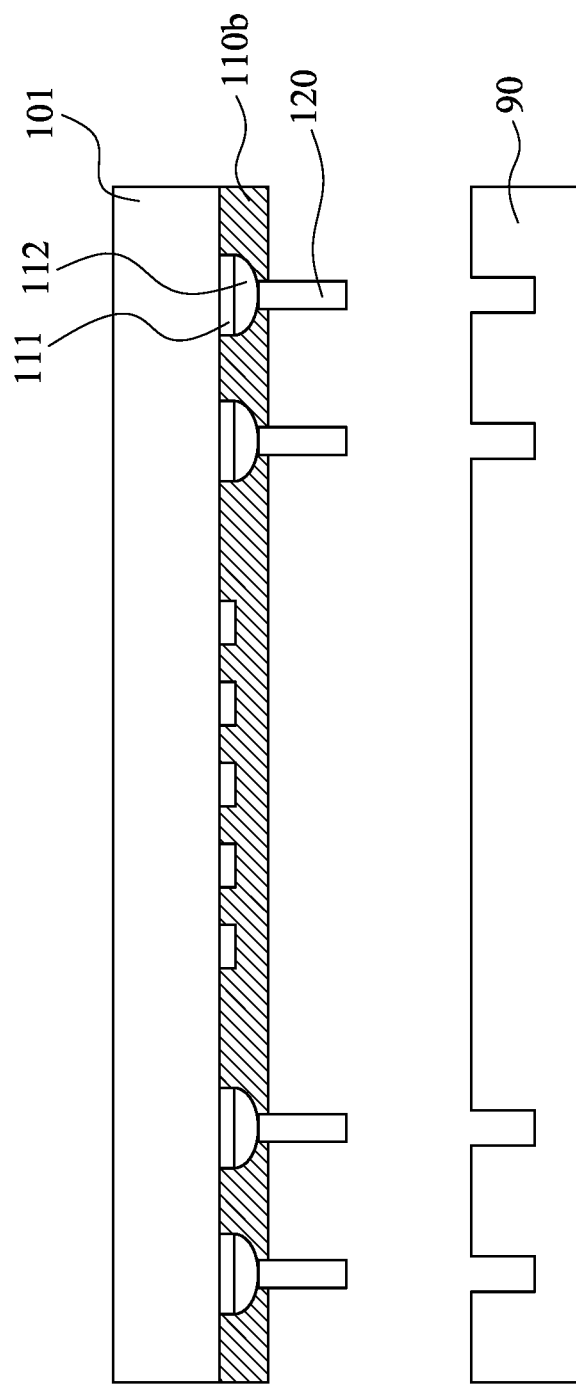

Attention is now invited to FIGS. 16A to 16E, illustrated another embodiment of the method shown in FIG. 14. Referring to FIG. 16a, in the present embodiment, the adhesive portions include more than the adhesive film 110b. The adhesive portions further include a plurality of pin pads 111, a plurality of die pads 113 and a plurality of solder pastes 112. Firstly, the pin pads 111 and die pads 113 are disposed on the surface of the carrier 101. The distribution of pin pads 111 corresponds to the pattern of micro pin 120 defined by the cavities 91, while the die pads 113 provide a die attaching area. Then a solder paste 112 is disposed on each of the pin pads 111. Next, the adhesive film 110b covers the islands constituted by the pin pad 111 and solder paste 112. The thickness of the adhesive film 110b exceeds the collective height of the pin pad 111 and solder paste 112. A close cross-sectional elevation view shown in FIG. 13, provides more information. The thickness T of the adhesive film 110b is greater than the apex of the solder paste 112 such that the solder pastes 112 and the pin and die pads 111, 113 are completely covered by the adhesive film 110b. Referring to FIG. 16B in conjunction with FIG. 16C, the carrier 101 is aligned with the pallet 90, and a pressure is applied to transfer the micro pins 120 to the carrier 101 under the first temperature. The relatively low first temperature prevents misalignment caused by different coefficients of thermal expansion. On the other hand, the solder pastes 112 are not in fully molten state for receiving the micro pins 120. The excessive portion of the adhesive film 110b holds the micro pins 120 at this stage. Each of the micro pins 120 barely contacts the apex of the solder paste 112 and is mostly held by the adhesive film 110b.

Figure 16D:
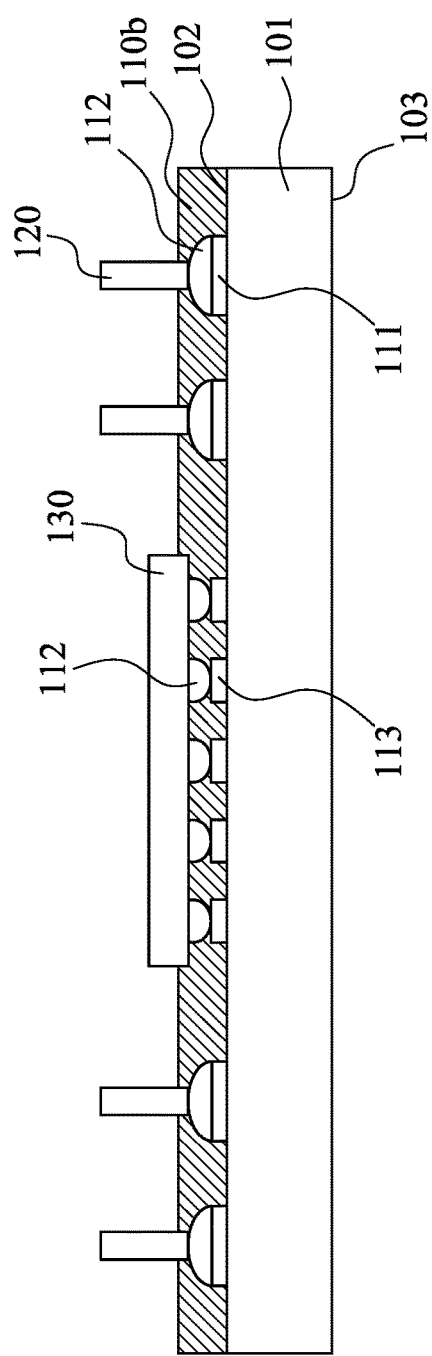

Attention is now invited to FIG. 16D. The die 130 is disposed on the die pads 113 with adhesive materials, for example, solder pastes or flux, sandwiched in between. The die 130 is bonded in a flip-chip form in the present embodiment. It should be understood that the die 130 may be disposed on the adhesive film 110b. Alternatively, the adhesive film 110b may be the discontinuous adhesive paste portions 110a, and the die 130 is disposed on the die attaching film 140 instead.

Finally, heating under the second temperature that allows solder reflow is applied, and micro pins 120 are pressed to the second depth shown in FIG. 16D. The high temperature, for example, approximately 220 degree Celsius, renders the solder pastes 112 fully molten for receiving the micro pins 120 further down until almost in contact with the pin pads 111. After curing, the semiconductor package structure is then ready to be combined with other components through the micro pins 120.

Figure 16E:
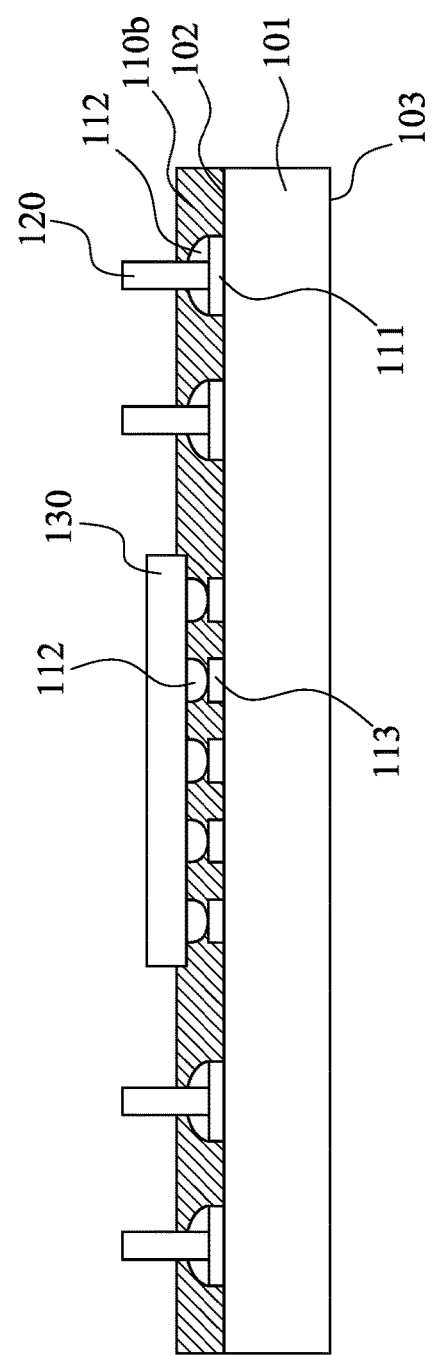

In some embodiments, a molding compound 150 is formed on the adhesive film 110b shown in FIG. 16E. The thickness of the molding compound 150 varies according to the remaining portion of the micro pin 120 that does not mate with the adhesive portion. The carrier 101 can then be removed since the molding compound 150 can support the structure of the assembly. It should be understood that the die 130 may be bonded in either normal or flip-chip form. When the die 130 is not in flip-chip form, the molding compound 150 along with the exposed tip of micro pins 120 and die pad forms a planar platform for receiving other components. When the die 130 is bonded in flip-chip form, the molding compound 150 exceeds the height of the die and reaches the tip of the micro pins 120. The molding compound strengthens the structural durability of the assembly, and therefore the carrier 101 can be removed. It should be understood that when the a number of the adhesive portions are spatially independent as shown in FIGS. 3 or 4, the molding compound 150 is built from the surface of the carrier 101. As a result, one side of the molding compound 150 is at the same level with the micro pins 120, while the opposite side thereof levels with pin pads 111.

The instant disclosure provides a semiconductor package structure for easier die bonding, robust interconnect structure and even smaller pitch. The adhesive portion of the instant disclosure appears in different forms, for example, individual adhesive paste portions, a blanket of adhesive film, pads and solder pastes. The adhesive portion holds the micro pins which are dotted at the perimeter region of a die, and the micro pins serve as interconnects. The micro pins can come into any geometrical configuration providing that they satisfy a diameter which is approximately 50 μm less than the length. The adhesive portion may be enhanced by the addition of pads and solder pastes. When the adhesive portion is in the form of adhesive film, the die can be attached to the adhesive film saving the use of other adhesive materials, for example, a die attaching film. The die may be bonded with pads revealed or in flip-chip state. The structural durability may be further improved by molding compound. In the presence of molding compound, the underlying carrier can be removed to yield another interface for connection. Compared to the conventional means to space apart two immediately adjacent packages, the production cost of micro pins is relatively less. Micro pins are more reliable in supporting the structure, and the pitch can be reduced to an extent that ensures tight package stacking at the same time without compromising the connection stability.

In some embodiments, a semiconductor package structure includes a molding compound, a micro pin extending through the molding compound, and a die surrounded by the molding compound. The micro pin has a top surface, a bottom surface, and a sidewall extending from the bottom surface to the top surface of the micro pin. The sidewall of the micro pin has a first portion and a second portion. The first portion of the sidewall is adjacent to the bottom surface of the micro pin and free of the molding compound. The second portion of the sidewall is adjacent to the top surface of the micro pin and in contact with the molding compound.

In still some embodiments, a semiconductor package structure includes a molding compound, a micro pin extending through the molding compound, and a die surrounded by the molding compound. A bottom surface of the molding compound has a first portion extending horizontally from a sidewall of the molding compound and a second portion extending upwards from an end of the first portion to a sidewall of the micro pin.

In yet some embodiments, a semiconductor package structure includes an adhesive film, a die over the adhesive film, a molding compound over the adhesive film and surrounding the die, a pin pad in the adhesive film, and a micro pin. The micro pin extends downwards from a top surface of the molding compound to a top surface of the pin pad.

The foregoing outlines features of several embodiments so that those skilled in the art may well understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package structure, comprising:
    a molding compound;
    a micro pin extending through the molding compound, wherein the micro pin has a top surface, a bottom surface, and a sidewall extending from the bottom surface to the top surface of the micro pin, the sidewall of the micro pin has a first portion and a second portion, the first portion of the sidewall of the micro pin is adjacent to the bottom surface of the micro pin and free of contact with the molding compound, and the second portion of the sidewall of the micro pin is adjacent to the top surface of the micro pin and in contact with the molding compound; and
    a device comprising a die surrounded by the molding compound and a die pad on a top surface of the die, wherein the bottom surface of the micro pin is lower than a bottom surface of the die, and a portion of the top surface of the molding compound extending from a top surface of the die pad to the top surface of the micro pin.

2. The semiconductor package structure of claim 1, wherein a height of the second portion of the sidewall of the micro pin is greater than a height of the first portion of the sidewall of the micro pin.

3. The semiconductor package structure of claim 1, further comprising:
    an adhesive portion surrounded by the molding compound, wherein a bottom surface of the adhesive portion is substantially aligned horizontally with a bottom surface of the molding compound, and a top surface of the adhesive portion is attached to the die.

4. The semiconductor package structure of claim 3, wherein the bottom surface of the micro pin is coplanar with the bottom surface of the adhesive portion.

5. The semiconductor package structure of claim 3, wherein a height of the first portion of the sidewall of the micro pin is less than a thickness of the adhesive portion.

6. The semiconductor package structure of claim 1, wherein a bottom surface of the molding compound has a first portion that is curved inwards and surrounds the micro pin.

7. The semiconductor package structure of claim 6, wherein the bottom surface of the molding compound has a second portion extending horizontally from a lower perimeter of the first portion of the molding compound.

8. A semiconductor package structure, comprising:
    a molding compound, wherein the molding compound is a single piece of continuous material;
    a micro pin extending through the molding compound, wherein a bottom surface of the molding compound has a first portion and a second portion, the first portion of the bottom surface of the molding compound has a first end and a second end, the first portion of the bottom surface of the molding compound extends starting from the first end thereof and laterally from a sidewall of the molding compound, the second portion of the bottom surface of the molding compound is a curved surface that continuously extends upwards from the second end of the first portion of the bottom surface of the molding compound to a sidewall of the micro pin; and
    a die surrounded by the molding compound.

9. The semiconductor package structure of claim 8, wherein the first portion of the bottom surface of the molding compound is substantially flat.

10. The semiconductor package structure of claim 8, wherein a bottom surface of the micro pin is coplanar with the first portion of the bottom surface of the molding compound.

11. The semiconductor package structure of claim 10, further comprising:
- an adhesive portion under the die, wherein a sidewall of the adhesive portion is in contact with the molding compound.

12. The semiconductor package structure of claim 10, wherein a lower portion of the micro pin is spaced apart from the molding compound.

13. A semiconductor package structure, comprising:
- an adhesive film;
- a device comprising a die over a top surface of a first portion of the adhesive film and a die pad on a top surface of the die;
- a molding compound over a top surface of a second portion of the adhesive film and surrounding the die, wherein the first portion of the adhesive film is directly connected to the second portion of the adhesive film;
- a pin pad in the second portion of the adhesive film; and
- a micro pin extending downwards from a top surface of the molding compound to a top surface of the pin pad, wherein a top surface of the micro pin is coplanar with a top surface of the die pad.

14. The semiconductor package structure of claim 13, further comprising:
- a solder feature over the pin pad and surrounding a lower portion of the micro pin.

15. The semiconductor package structure of claim 14, wherein a top of the solder feature is lower than the top surface of the second portion of the adhesive film.

16. The semiconductor package structure of claim 13, wherein the molding compound is in contact with the top surface of the second portion of the adhesive film.

17. The semiconductor package structure of claim 13, wherein the micro pin has a portion surrounded by and in contact with the second portion of the adhesive film.

18. The semiconductor package structure of claim 13, wherein the micro pin has a portion surrounded by and in contact with the molding compound.

19. The semiconductor package structure of claim 13, wherein a bottom surface of the pin pad is coplanar with a bottom surface of the adhesive film.

20. The semiconductor package structure of claim 13, wherein the top surface of the first portion of the adhesive film is coplanar with the top surface of the second portion of the adhesive film and in contact with a bottom surface of the die.

* * * * *